United States Patent
Suh et al.

(10) Patent No.: US 7,475,383 B2
(45) Date of Patent: Jan. 6, 2009

(54) METHOD OF FABRICATING PHOTO MASK

(75) Inventors: Sung-Soo Suh, Yongin-si (KR); Young-Seog Kang, Yongin-si (KR); In-Sung Kim, Suwon-si (KR)

(73) Assignee: Samsung Electronics Co. Ltd., Gyeonggi-Do (KR)

( * ) Notice: Subject to any disclaimer, the term of this patent is extended or adjusted under 35 U.S.C. 154(b) by 96 days.

(21) Appl. No.: 11/589,055

(22) Filed: Oct. 30, 2006

(65) Prior Publication Data

US 2007/0162887 A1  Jul. 12, 2007

(30) Foreign Application Priority Data

Oct. 28, 2005  (KR) .................. 10-2005-0102471

(51) Int. Cl.
*G06F 17/50* (2006.01)
*G06F 19/00* (2006.01)
*G03F 1/00* (2006.01)
*G21K 5/00* (2006.01)

(52) U.S. Cl. .................. 716/21; 700/96; 700/120; 700/121; 430/5; 378/35

(58) Field of Classification Search .................. 716/21; 700/98, 120, 121; 430/5; 378/35
See application file for complete search history.

(56) References Cited

U.S. PATENT DOCUMENTS

| | | | |
|---|---|---|---|
| 6,136,478 A | 10/2000 | Usui et al. | |
| 6,415,421 B2 | 7/2002 | Anderson et al. | |
| 6,584,609 B1 * | 6/2003 | Pierrat et al. ............... | 716/19 |
| 6,988,259 B2 * | 1/2006 | Pierrat et al. ............... | 716/19 |
| 7,024,655 B2 * | 4/2006 | Cobb ........................ | 716/19 |
| 7,065,738 B1 * | 6/2006 | Kim ......................... | 716/19 |
| 7,082,596 B2 * | 7/2006 | Liu .......................... | 716/19 |
| 7,234,130 B2 * | 6/2007 | Word et al. ................. | 716/21 |
| 7,383,530 B2 * | 6/2008 | Wang et al. ................. | 716/21 |
| 7,392,502 B2 * | 6/2008 | Percin et al. ................ | 716/19 |
| 2003/0097647 A1 * | 5/2003 | Pierrat et al. ............... | 716/19 |
| 2003/0115569 A1 * | 6/2003 | Ikeuchi ..................... | 716/19 |
| 2004/0019872 A1 | 1/2004 | Lippincott et al. | |
| 2004/0170905 A1 * | 9/2004 | Liebmann et al. ........... | 430/5 |
| 2004/0221254 A1 * | 11/2004 | Cobb ........................ | 716/19 |

(Continued)

FOREIGN PATENT DOCUMENTS

JP   11-133586   5/1999

(Continued)

*Primary Examiner*—Phallaka Kik
(74) *Attorney, Agent, or Firm*—Harness, Dickey & Pierce, P.L.C.

(57) ABSTRACT

Provided is a method of fabricating a photo mask. The method includes preparing a model group including optical proximity correction (OPC) models and generating a preliminary mask layout using an integrated circuit (IC) layout. A contour image may be produced from the preliminary mask layout through a simulation using an optical model. Subsequently, the preliminary mask layout may be compared with the contour image and the comparison result may be analyzed to produce analysis data for providing criteria used in selecting an OPC model. An OPC model suitable for the preliminary mask layout may be selected from the model group based on the analysis data. An OPC process may be performed on the preliminary mask layout using the selected OPC model to generate a mask layout.

20 Claims, 14 Drawing Sheets

U.S. PATENT DOCUMENTS

| | | | |
|---|---|---|---|
| 2004/0225488 A1* | 11/2004 | Wang et al. | 703/22 |
| 2005/0120326 A1* | 6/2005 | Semmler et al. | 716/19 |
| 2005/0216878 A1* | 9/2005 | Word et al. | 716/21 |
| 2006/0062445 A1* | 3/2006 | Verma et al. | 382/144 |
| 2006/0070018 A1* | 3/2006 | Semmler | 716/21 |
| 2006/0085772 A1* | 4/2006 | Zhang | 716/4 |
| 2007/0006116 A1* | 1/2007 | Percin et al. | 716/21 |
| 2007/0074142 A1* | 3/2007 | Smayling et al. | 716/21 |
| 2007/0250805 A1* | 10/2007 | Wang et al. | 716/21 |

FOREIGN PATENT DOCUMENTS

| | | |
|---|---|---|
| JP | 2000-081697 | 3/2000 |
| JP | 2004-004941 | 1/2004 |
| KR | 10-2003-0028407 | 4/2003 |
| KR | 1020050002650 A | 1/2005 |

* cited by examiner

Mask Pattern

Pattern Developed on Wafer

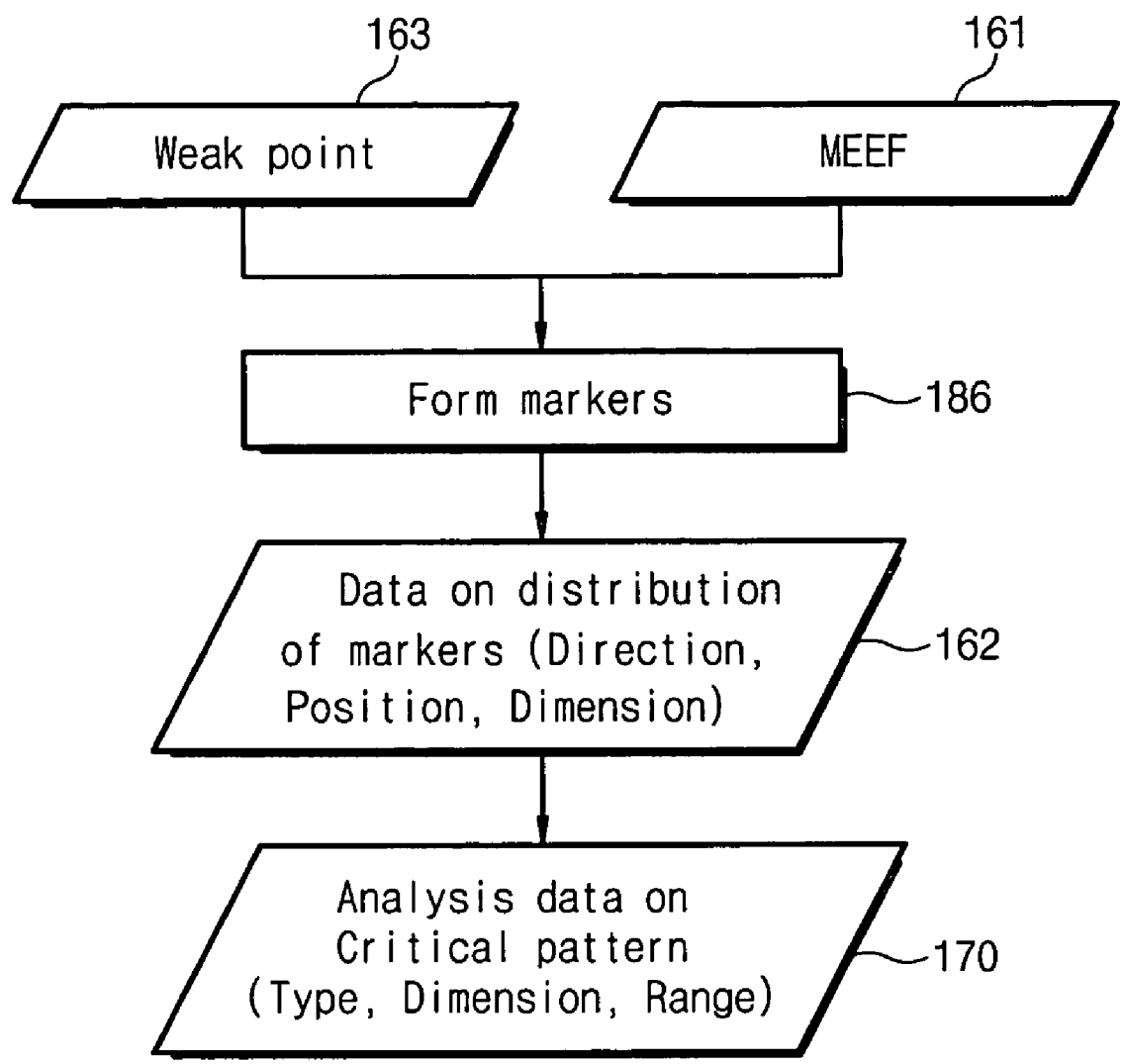

METHOD OF FABRICATING PHOTO MASK

PRIORITY STATEMENT

This application claims priority under 35 USC § 119 to Korean Patent Application No. 2005-0102471, filed on Oct. 28, 2005, in the Korean Intellectual Property Office (KIPO), the entire contents of which are herein incorporated by reference.

BACKGROUND

1. Field

Example embodiments relate to a method of fabricating a photo mask that may improve or optimize optical proximity correction (OPC).

2. Description of the Related Art

In general, a lithography technique used for fabrication of semiconductor devices involves transferring a pattern formed on a photo mask to a wafer through an optical lens. However, as the integration density of semiconductor devices increase, the size of mask patterns may approximate to the wavelength of a light source, resulting in the lithography technique being affected by diffraction and/or interference of light. Because an optical system for projecting an image may function as a low-pass filter, a photoresist pattern formed on a wafer may be distorted from the original shape of a mask pattern, as shown in FIGS. 1A and 1B.

When the size (or period) of the mask pattern is larger, the spatial frequency is lower. Thus, a light with various frequencies is transmitted through the mask pattern. As a result, an image similar to the original pattern is formed on the wafer. However, a portion of photo mask with a higher spatial frequency (e.g., an edge) may be distorted in a round shape. This distortion of an image is called an "optical proximity effect (OPE)." As the pattern size is reduced, the spatial frequency is increased such that the number of frequencies transmitted is reduced. Thus, a distortion of an image due to the OPE becomes worse.

An optical proximity correction (OPC) technique may be provided to overcome the OPE, which may be a principal cause of image distortion. According to an OPC technique, the shape of a mask pattern may be intentionally changed to correct the image distortion. OPC may lead to improvements in optical resolution and pattern transfer fidelity. OPC may use methods of adding/removing sub-resolution fine patterns to/from a mask pattern formed on a photo mask (e.g., line-end treatment or insertion of scattering bars). Line-end treatment may include adding a corner Serif pattern or a hammer pattern in order to overcome the rounding of an end portion of a line pattern as shown in FIG. 2A. The insertion of scattering bars may include adding sub-resolution scattering bars around a target pattern to reduce or minimize variation in pitches on the patterns with respect to pattern density as shown in FIG. 2B.

OPC has been considered a lithography technique, but currently is used as a design and CAD technique. A layout process may have been followed by design rule checks (DRC), electrical rule checks (ERC), electrical parameter extraction (EPE), and layout versus schematic (LVS) verification, but an operation of intentionally changing a layout using an OPC program may be added.

An OPC program may be categorized as either a rule-based method, processing layout data under rules prepared from lithography engineers' experience, or a model-based method, in which a layout may be modified based on the mathematical model of a lithography system.

Rule-based methods may comprise several rules including modifying a layout based on the rules and that a pattern may be partially cut or a small subsidiary pattern may be added and made beforehand. Rule-based OPC techniques may not correct the layout based on simulation results, a pattern formed on a wafer may not be as precise as required. But, rule-based methods may have an advantage of faster operating speed because layout data corresponding to the entire region of a chip may be processed at one time. However, it may be possible that many trial and error iterations are needed to apply a rule-based method to a new lithography process adopting different lithography apparatuses and/or a new illumination technique. Therefore, because of rapid technical developments, new rules based upon experimentation should be continuously made.

Model-based methods, adopting a mathematical model of an optical lithography system, may correct the deformation of a mask pattern by applying the model of the lithography system to a negative feedback system. Because model-based methods may be based on repeated calculation, a required operation time may be larger. Hence, the model-based method may be applied to a smaller amount of data. However, the model-based method may provide an improved or optimized OPC result, irrespective of the shapes of patterns. Further, model-based methods may find a solution even if a predetermined or given rule-set is not applied, and may be used to obtain a rule-set of a rule-based program. Thus, an improved or optimal solution is provided for various patterns with only a few experiments. As a result, when an improved or optimal solution is required irrespective of time, for example, in the case of a memory cell, a model-based OPC method may be preferred.

FIGS. 3 and 4 are process flow charts illustrating conventional methods of fabricating photo masks. Referring to FIG. 3, a conventional OPC method may include an OPC operation 30 of correcting a preliminary mask layout 25 using an OPC model 15. The OPC model 15 may be selected from a group of OPC models including various OPC models that are experimentally prepared based on the results of a lithography process using a test mask 10 having test patterns with various shapes and sizes. Considering the OPC model 15, it may be seen that the OPC operation 30 may be a model-based OPC process.

In operation 40, a photo mask may be fabricated using a mask layout 35 formed in the OPC operation 30. In operation 45, a process margin of the fabricated photo mask may be confirmed by analyzing the result of a lithography process using the fabricated photo mask.

When the fabricated photo mask satisfies a required process margin, the photo mask may be used for a lithography operation 50. When the fabricated photo mask does not have the required process margin, the photo mask may be rejected and a new photo mask may be fabricated. This re-fabrication of the photo mask causes an increase in fabrication cost and a delay in the date of delivery. In this case, the OPC model 15 may be inappropriate for the OPC operation 30 and a failure in the photo mask may be induced. Accordingly, it may be important to apply an appropriate OPC model in order to reduce the fabrication cost of photo masks and to improve productivity.

A conventional OPC method may select the OPC model 15 based upon the engineers' experience instead of providing a method for selecting an appropriate OPC model based upon the preliminary mask layout. As a result, the appropriateness of the OPC model 15 applied to the OPC operation 30 may depend greatly upon the engineers' experience. Further, the efficiency, or the operating time of the OPC operation 30 may be determined by the appropriateness of the OPC model 15. Therefore, when an unnecessarily strict OPC model is selected, the productivity of the OPC operation 30 may deteriorate. Because the appropriateness of the OPC model 15 depends upon the engineers' experience, this conventional OPC method may not reduce or prevent an unnecessarily strict OPC method from being selected.

As shown in FIG. 3, a conventional OPC method may further include a clip evaluation operation 20 of appreciating the appropriateness of the selected OPC model 15 by sampling a partial region of the preliminary mask layout 25. However, because the sampled region may be selected by engineers' experience, the dependence of the appropriateness of the OPC model 15 on the engineers' experience may not be completely overcome.

Referring to FIG. 4, another conventional OPC method may include an OPC virtual detection operation 60 of appreciating the appropriateness of the entire mask layout 35 using a virtual detection model before the photo mask is fabricated in operation 40. If it is determined that the evaluation result on weak point data 65 meets a predetermined or given standard in the OPC virtual detection operation 60, a photo mask may be fabricated using the mask layout 35 in operation 40. If not, the virtual detection model may be evaluated in operation 70. If the used virtual detection model is proper, the mask layout 35 may be denied, and a series of processes for forming a new mask layout may be repeated.

This second conventional OPC method may prevent or reduce an occurrence of a photo mask from being fabricated using an inappropriate mask layout 35, because the OPC virtual detection operation 60 may precede the operation 40 of fabricating the photo mask. However, the OPC model 15 may be selected by the engineers' experience, similar to the previously described conventional OPC method. Thus, this OPC method also may not overcome the dependence of the appropriateness of the OPC model on the engineers' experience. In other words, this conventional OPC method should also select an improved or optimized OPC model after trial and error. As a consequence, it may be difficult to improve the productivity of an OPC process.

SUMMARY

Example embodiments provide a method of fabricating a photo mask that may select an improved or optimized optical proximity correction (OPC) model without depending on the engineers' experience. Example embodiments also provide a method of fabricating a photo mask that leads to an improvement in the productivity of an OPC process. Further, example embodiments provide a method of fabricating a photo mask that may increase the accuracy of an OPC process.

According to example embodiments, a method of fabricating a photo mask may include preparing a model group including OPC models. A preliminary mask layout may be generated using an integrated circuit (IC) layout. A contour image may be produced from the preliminary mask layout through a simulation using an optical model. The preliminary mask layout may be compared with the contour image and the comparison result may be analyzed to produce analysis data for providing criteria used in selecting an OPC model. An OPC model suitable for the preliminary mask layout may be selected from the model group based on the analysis data. An OPC process may be performed on the preliminary mask layout using the selected OPC model to generate a mask layout.

In example embodiments, the optical model may include data on process parameters applied to a lithography process and an etching process. Also, the OPC models of the model group may be prepared by analyzing lithography data obtained using a given test mask including patterns with various structures and sizes according to the pattern type and size. Further, the OPC models of the model group may be prepared by analyzing the influences of process parameters on a lithography process.

The generation of the preliminary mask layout may include applying resolution enhancement technology (RET) to the IC layout by use of resolution enhancement data containing information on the RET. The resolution enhancement data may be updated using the analysis data.

In example embodiments, the analysis data may include information on pattern types, criteria set for admitting models, and/or critical points. More specifically, the production of the analysis data may include producing weak point data and mask error enhancement factor (MEEF) data. In this case, the production of the weak point data may include production data on the positions of weak points at which there may be a big difference between the IC layout and the contour image. Also, the production of the MEEF data may include preparing a MEEF map through a simulation for estimating the influences of process deviations in the fabrication of the photo mask and a lithography process, and sampling data on points affected by the process deviations by comparing the MEEF map with the contour image.

The production of the analysis data may further include producing marker analysis data based on at least one of the weak point data and the MEEF data. Specifically, the production of the marker analysis data may include forming markers in one of the critical points and adjacent regions thereof and sampling data on the pattern type, dimension, and range of the critical point by analyzing the distribution of the markers based on directions, positions, and dimensions. In this case, the critical points may include at least one of the points at which there may be a difference between the preliminary mask layout and the contour image, which constitute the weak point data, and points at which there may be a difference between the MEEF map and the contour image, which constitute the MEEF data.

According to example embodiments, the selection of the OPC model may include selecting at least one OPC model applicable to the preliminary mask layout from the model group based on at least one selected from the analysis data (e.g. information on the pattern types and critical points). Thereafter, the selected OPC models may be appreciated in terms of appropriateness based on the criteria set for admitting models (e.g., the analysis data), and an OPC model with the highest appropriateness may be selected from the appreciated OPC models.

In example embodiments, the selection of the OPC model may include dividing the preliminary mask layout into a plurality of partial regions and selecting a localized OPC model suitable for each of the partial regions. In this case, the selection of the localized OPC models may include selecting an OPC model to which strict criteria may be applied when a selected partial region may include the critical point and selecting an OPC model to which less strict criteria may be applied when the selected partial region may be freed from the critical point.

According to example embodiments, the selection of the OPC model may include automatically selecting an optimal OPC model from the OPC model group based on the analysis data that may be sampled from the preliminary mask layout.

BRIEF DESCRIPTION OF THE DRAWINGS

Example embodiments will be more clearly understood from the following detailed description taken in conjunction with the accompanying drawings. FIGS. 1A-12B represent non-limiting, example embodiments as described herein.

FIGS. 1A and 1B are photographs illustrating an example of an optical proximity effect;

FIGS. 3 and 4 are process flow charts illustrating conventional methods of fabricating photo masks;

FIG. 5 is a process flow chart illustrating a method of fabricating a photo mask according to example embodiments;

FIG. 6 is a process flow chart illustrating a method of fabricating a photo mask according to example embodiments;

FIG. 8 is a process flow chart illustrating a method of sampling marker distribution data according to example embodiments;

FIG. 12b is an example photograph demonstrating a result obtained by superposing the MEEF map on a contour image.

DETAILED DESCRIPTION OF EXAMPLE EMBODIMENTS

Figure 1A:
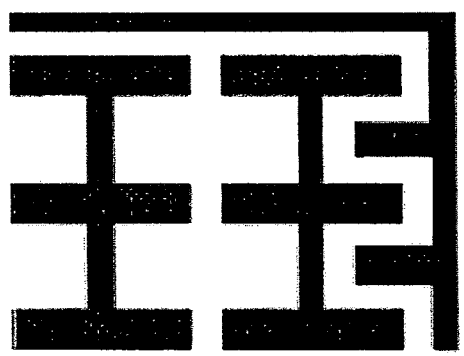
Figure 1B:
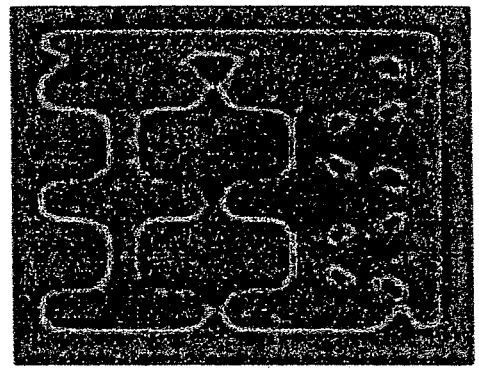
Figure 2A:
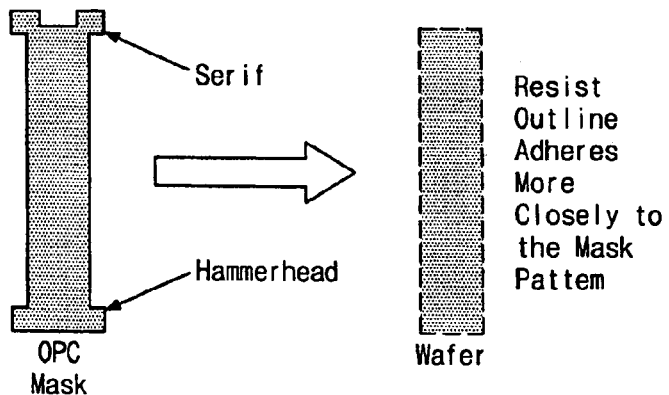
FIG. 2A is a diagram illustrating an example of line-end treatment for optical proximity correction (OPC)
Figure 2B:
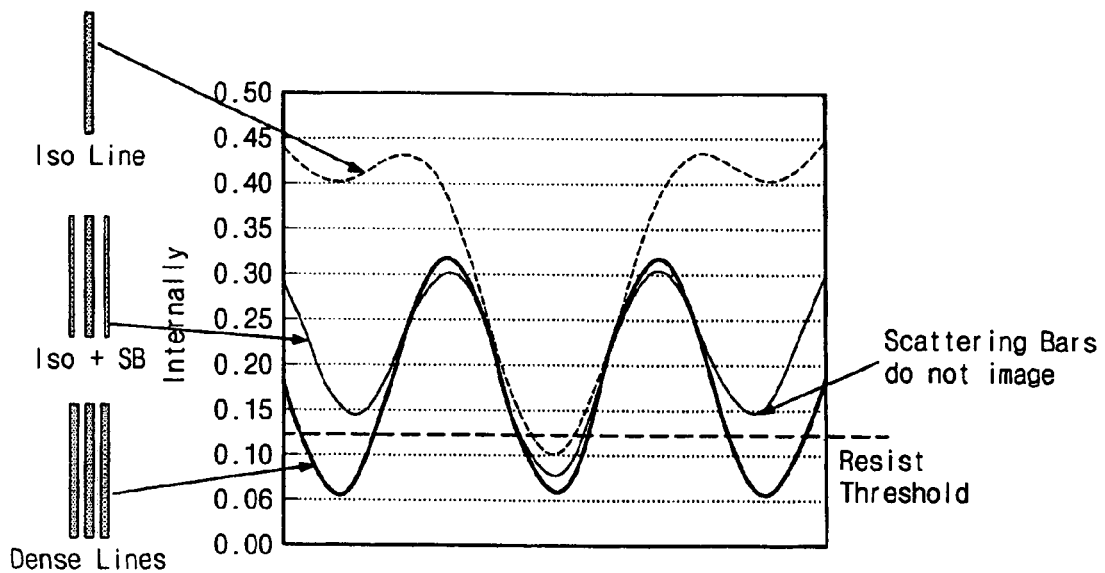
FIG. 2B is a diagram illustrating an example of insertion of scattering bars for OPC.
Figure 3:
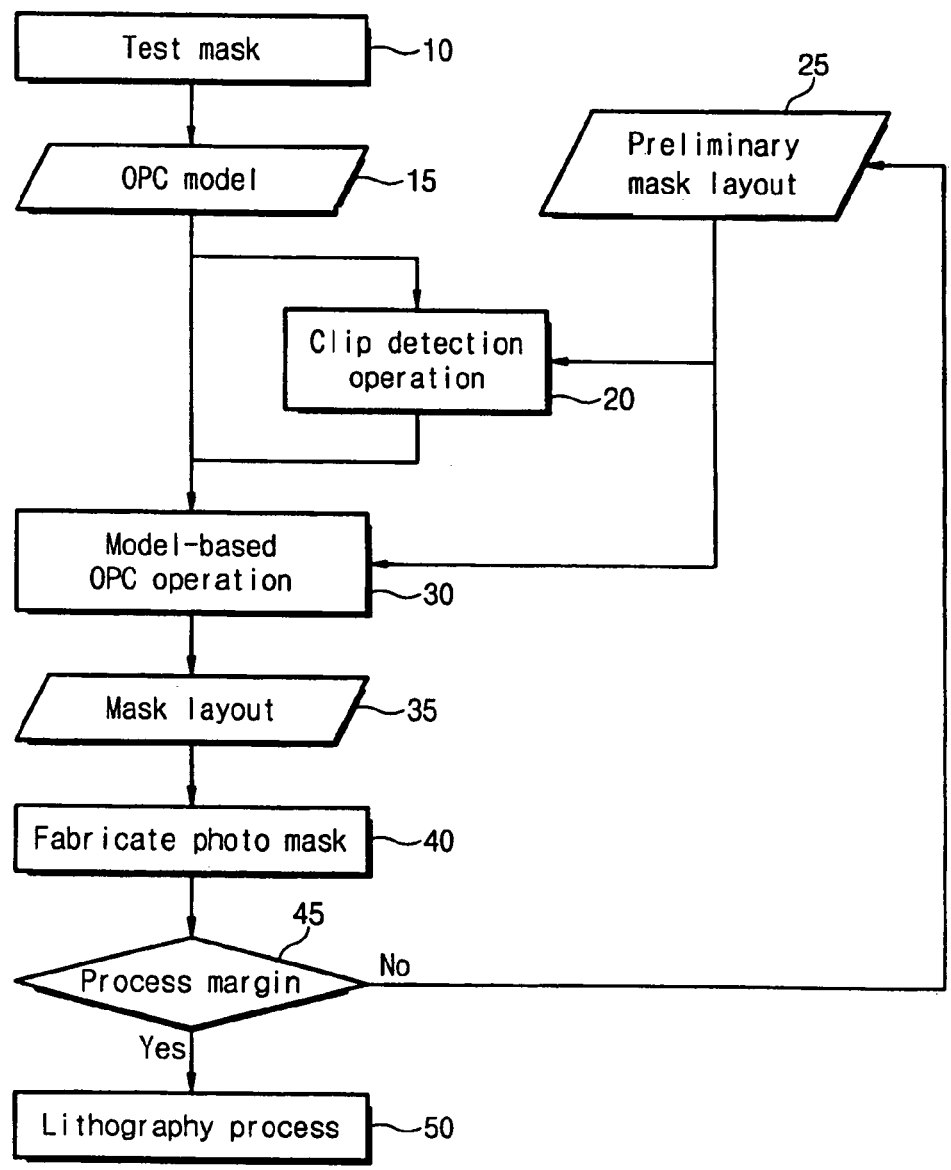
Figure 4:
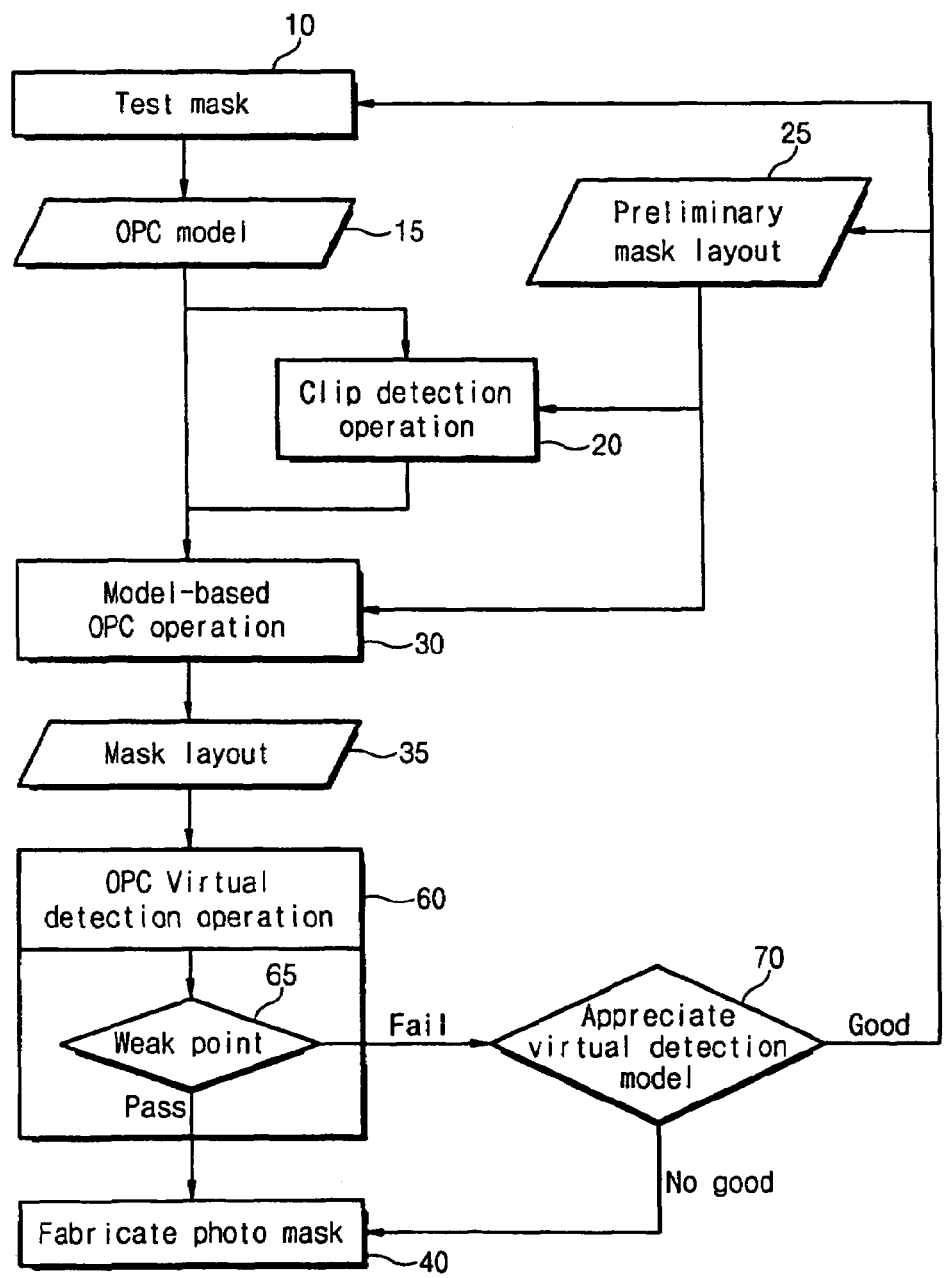

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from other region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
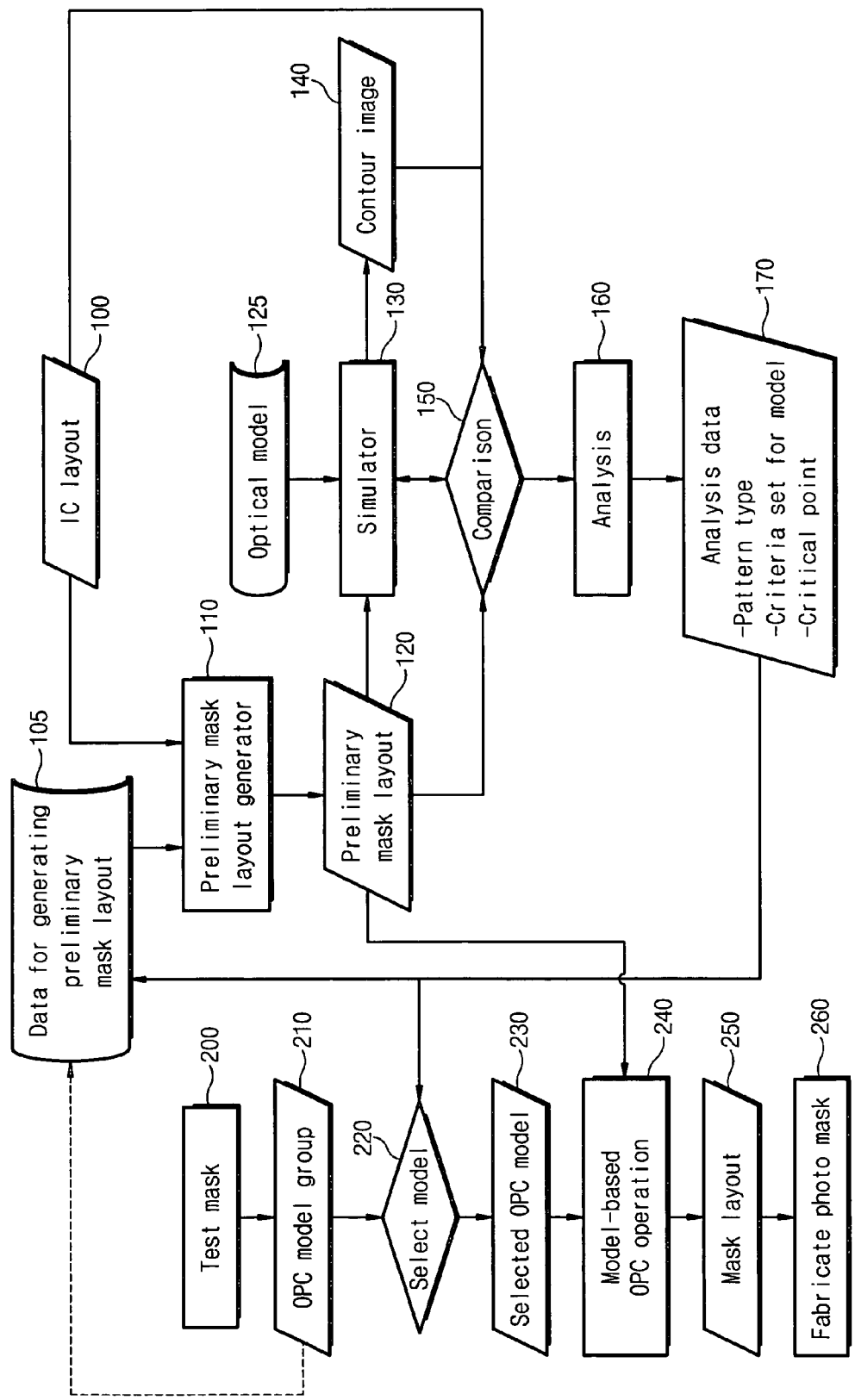

FIG. 5 is a process flow chart illustrating a method of fabricating a photo mask according to example embodiments.

Referring to FIG. 5, the method of fabricating a photo mask according to example embodiments may include generating a preliminary mask layout 120 using an integrated circuit (IC)

layout 100. The IC layout 100 may include data (e.g., GDS II) in a suitable format to define a target pattern that will be printed. As described above, target patterns of the IC layout 100 may not be precisely transferred on a wafer due to various optical effects, for example, an optical proximity effect (OPE).

Generating the preliminary mask layout 120 may include changing the IC layout 100 by use of a preliminary mask layout generator 110 in order to overcome imprecise transfer of the target pattern and to improve the resolution of a lithography process. Changing the IC layout 100 may be performed using data for generating a preliminary mask layout 105 containing information on resolution enhancement technology (RET). The RET, as well known, may include phase-shifting mask technology, scattering bar insertion, and etch skew correction.

A mask layout 250 may be generated using the preliminary mask layout 120. The mask layout 250 may include data (e.g., GDS II) in a suitable format to define a mask pattern that will be formed on the photo mask. The mask layout 250 may be specially prepared to reduce or minimize distortion of images due to an OPE. The mask layout 250 may be generated in an optical proximity correction (OPC) operation 240 by changing the preliminary mask layout 120 based on a selected OPC model 230.

The OPC model 230 on which the OPC operation 240 may be based is selected from an OPC model group 210 including various OPC models in operation 220. The OPC model group 210 may be prepared by analyzing the influences of process parameters on a lithography process. The preparation of the OPC model group 210 may be carried out using measured data that may be obtained from experiments on a test mask 200 including test patterns with various structures and sizes. The measured data may be obtained by analyzing the resultant structures printed on the wafer by use of the test mask 200 according to the pattern type and size.

According to example embodiments, the test mask 200 may be prepared in correspondence with various shapes and arrangements of real patterns (e.g., target patterns) that may be formed on the wafer. For example, the test mask 200 may be constructed to monitor diverse OPEs, for example, line-end type test patterns, line and space type test patterns, isolated bar type test patterns, and isolated space type test patterns may be formed on the test mask 200. However, it is apparent that these types of test patterns may be modified if required.

In example embodiments, the OPC model 230, which may be the most suitable for the preliminary mask layout 120, may be automatically selected from the OPC model group 210 based on analysis data 170 that may be sampled from the preliminary mask layout 120. As a result, example embodiments may overcome the dependence on the engineers' experience in regards to the appropriateness of the OPC model 230.

The analysis data 170 may be sampled by comparing a contour image 140, derived from the preliminary mask layout 120, with the IC layout 100 (or the preliminary mask layout 120) in operation 150 and analyzing the comparison result in operation 160. The contour image 140, which refers to an estimated profile of a photoresist pattern to be formed on the wafer, may be produced by a simulator 130 using the preliminary mask layout 120 and an optical model 125 as input data. The contour image 140 may be obtained based not on the mask layout 250 used as input data required for fabrication of a real photo mask but on the preliminary mask layout 120 required for generation of the mask layout 250.

The optical model 125 may contain data on the process parameters (e.g., the intensity and wavelength of exposure beams, physical parameters related with an illumination system, and the physical and chemical properties of photoresist) of a lithography process. Furthermore, the optical model 125 may contain data on the process parameters of a subsequent etching process using a photoresist pattern formed by use of the photo mask as an etch mask.

The analysis data 170, which may be obtained from the comparison and analysis operations 150 and 160, may include information to be considered by engineers in selecting the OPC model 230. For example, the analysis data 170 may include information on pattern types, the positions of critical points, and a criteria set for models.

The selection operation 220 will now be described in more detail. At the outset, a plurality of OPC models that may be applicable to the preliminary mask layout 120 may be selected from the OPC model group 210 based on the information on the pattern types. An OPC model that may be applicable to the preliminary mask layout 120 may be selected from the OPC models based on the information on the positions of critical points. At this time, if the pattern types and critical points are not set based on a strict criteria, a plurality of OPC models may be selected through the aforementioned operations. The OPC models selected based on the information on the criteria set for admitting models may be appreciated in terms of appropriateness, and the OPC model 230 with the highest appropriateness may be selected from the appreciated OPC models. As a consequence, the selection operation 220 corresponds to a method of searching an OPC model that meets all the requirements of the analysis data 170. However, if required, the substances and conditions of the analysis data 170, and a method of selecting the OPC model 230 may be modified.

Figure 6:
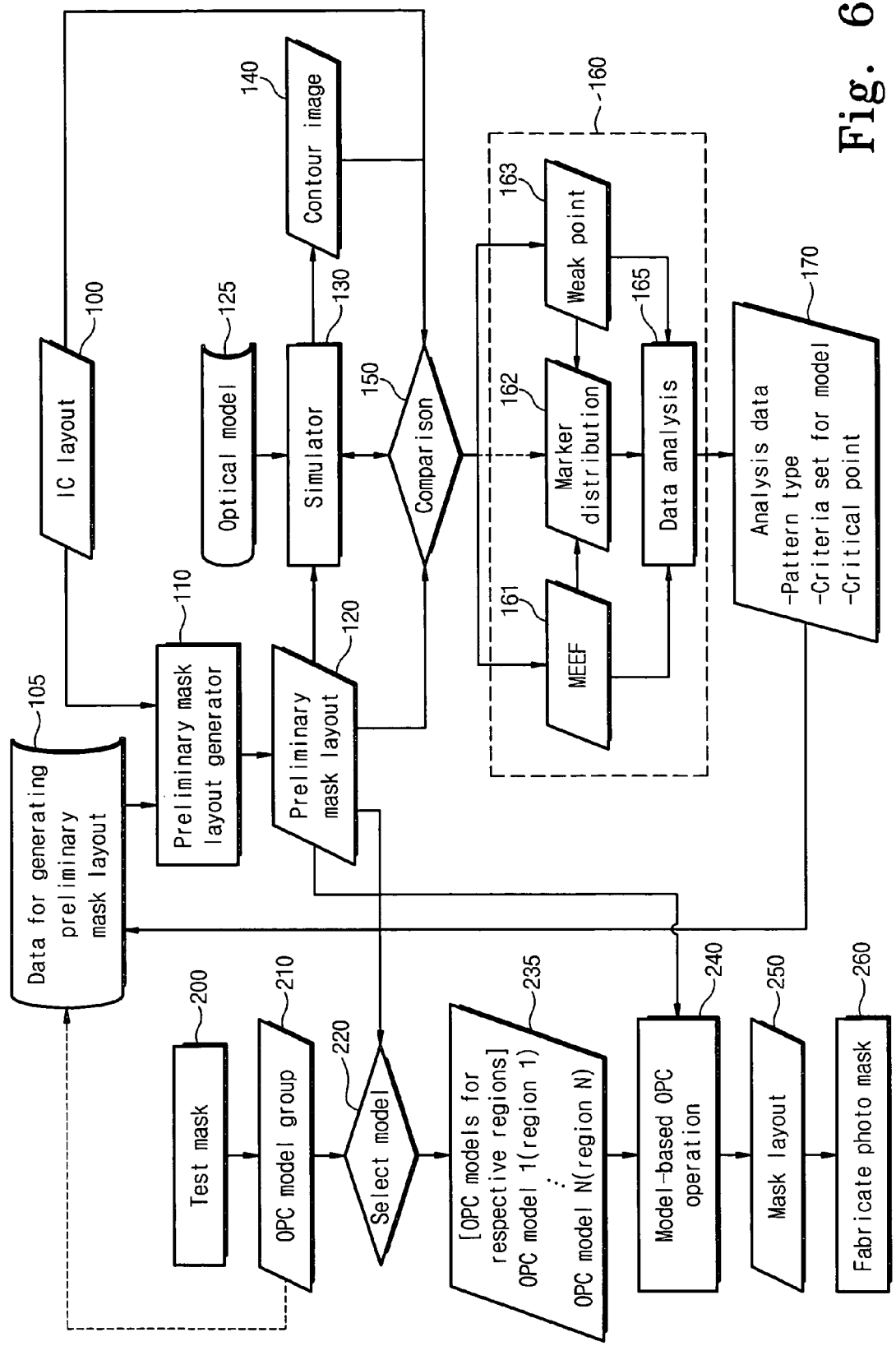

FIG. 6 is a process flow chart illustrating a method of fabricating a photo mask according to example embodiments.

Referring to FIG. 6, the selection operation 220 may include dividing the preliminary mask layout 120 into a plurality of partial regions and separately selecting an OPC model 235 appropriate for the respective partial regions based on the analysis data 170. In example embodiments, the selected OPC model 235 may comprise a plurality of localized OPC models corresponding to the partial regions of the preliminary mask layout 120. A method of selecting each of the localized OPC models may be the same as described with reference to FIG. 5 except that a region to be considered may be a portion of the preliminary mask layout 120.

In example embodiments, the localized OPC models of the OPC model 235 may be classified into strong OPC models and weak OPC models depending on the strictness of the applied criteria. The strong OPC model makes the OPC operation 240 more accurate or precise but leads the OPC operation 240 to involve a great number of complicated calculation operations. On the other hand, the weak OPC model enables rough and sufficient OPC operations and permits the OPC operation 240 to involve fewer calculation operations than the strong OPC model. However, it may be obvious that the strictness of the OPC model 235 may be dependent upon the substance thereof.

In example embodiments, when the partial region of the preliminary mask layout 120 includes a critical point, a strict OPC model may be applied to the partial region. When the partial region does not include the critical point, a less strict OPC model may be applied to the partial region. As mentioned above, the information on the critical points constitutes the analysis data 170, which may be obtained in the comparison and analysis operations 150 and 160. For example, the analysis operation 160 may include sampling at least one of the mask error enhancement factor (MEEF) data 161, marker distribution data 162, and weak point data 163. The weak point data 163 may be derived from the comparison operation 150. The MEEF data 161 may be obtained through an additional simulation operation, and the marker distribution data 162 may be provided based on the MEEF data 161 or the weak point data 163. The sampling of the (MEEF) data 161, marker distribution data 162, and weak point data 163 will be described in more detail with reference to FIGS. 7A, 7B, and 8.

Figure 7A:
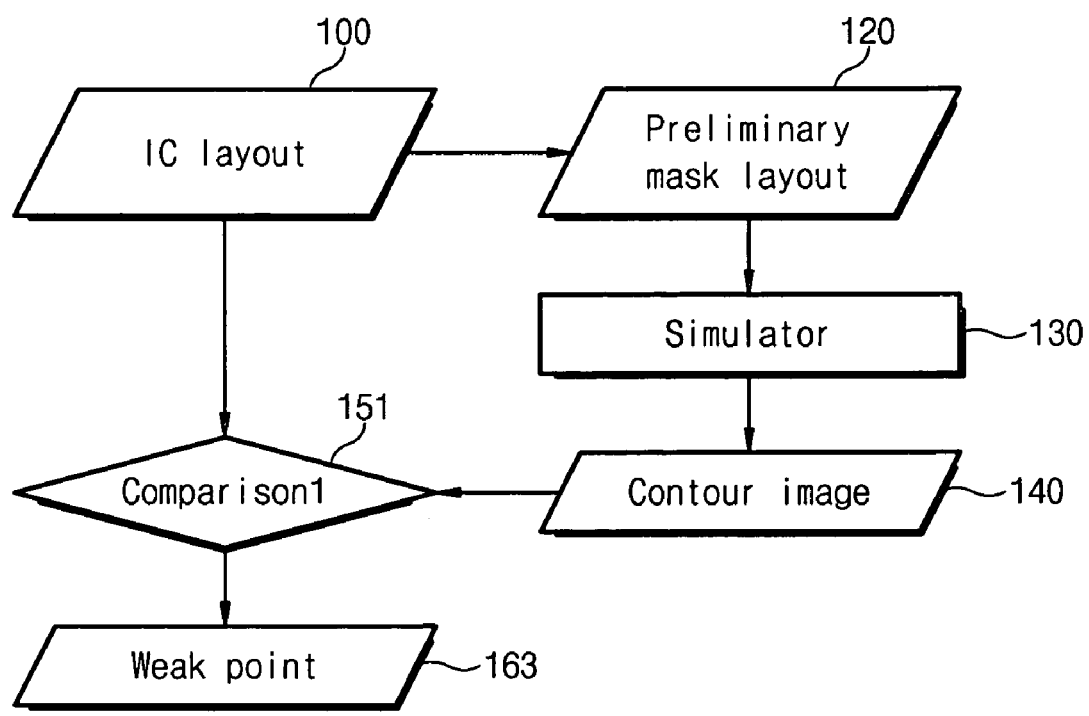
FIG. 7A is a process flow chart illustrating a method of sampling weak point data according to example embodiments.

FIG. 7A is a process flow chart illustrating a method of sampling weak point data according to example embodiments.

Figure 9A:
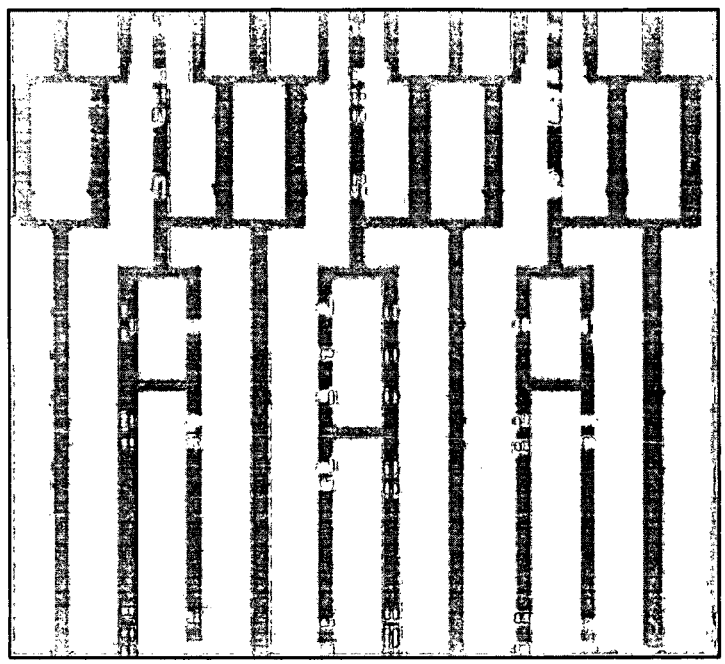
FIGS. 9A and 10A are example photographs illustrating the layouts of an integrated circuit (IC)
Figure 9B:
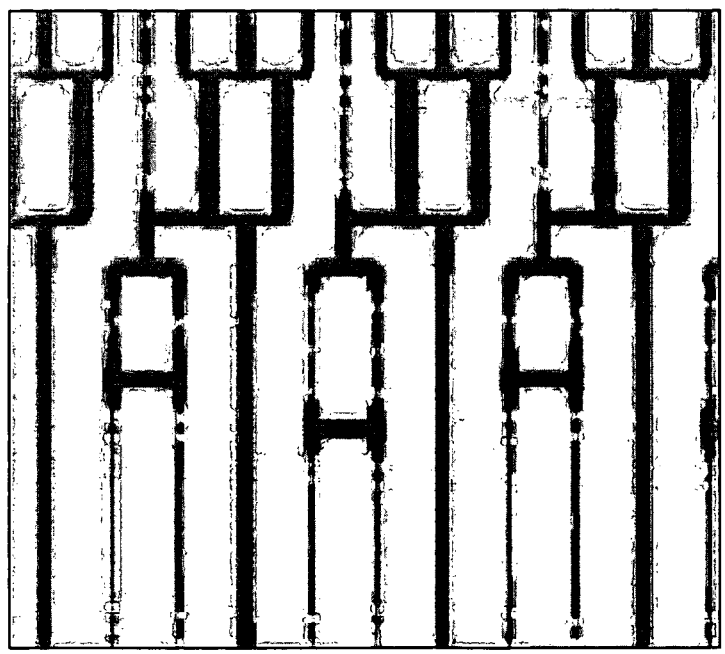
FIGS. 9B and 10B are example photographs demonstrating results obtained by superposing a contour image on the IC layouts.
Figure 10A:
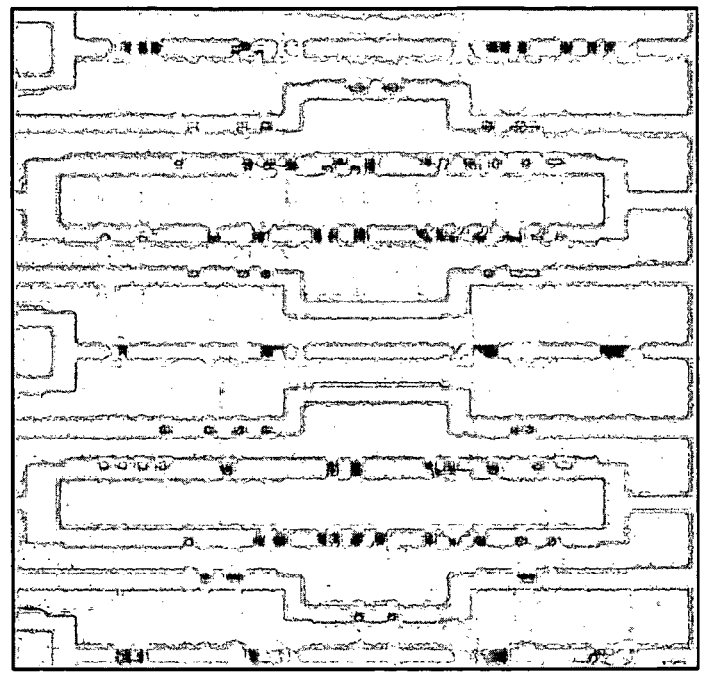
Figure 10B:
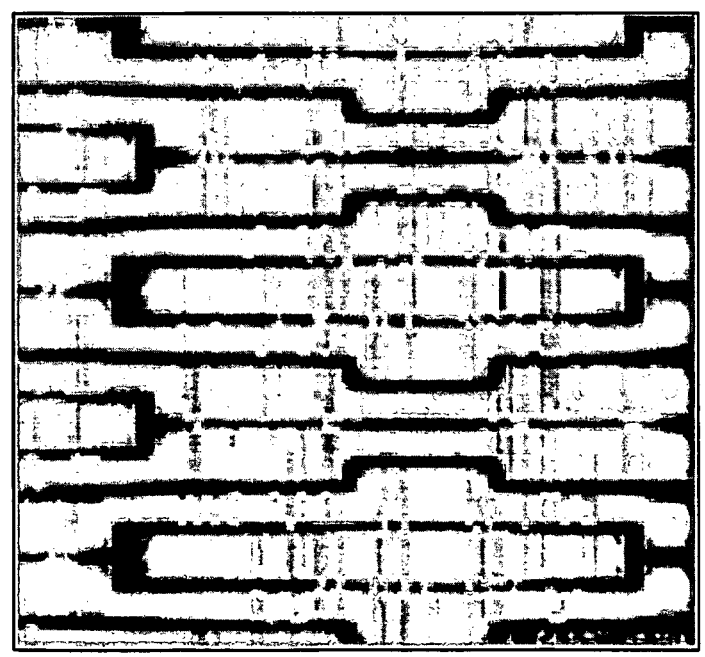

Referring to FIG. 7A, the weak point data 163 may be sampled based on the results of a comparison 151 of the IC layout 100 and the contour image 140. A weak point may be defined as a point at which a difference between a desired pattern and a real pattern formed on a wafer, which may be caused by the foregoing OPE, exceeds a reference value. Thus, the sampling of the weak point data 163 may include sampling the positions of points at which there may be a difference between the IC layout 100 and the contour image 140. FIGS. 9A and 10A are photographs illustrating the layouts of an IC, and FIGS. 9B and 10B are photographs showing results obtained by superposing a contour image on the IC layouts in order to make a comparison between the contour image and the IC layouts. Markers illustrated in FIGS. 9A, 10A, 9B, and 10B may be formed to monitor critical points, which will be described in detail later.

The sampling of the weak point data 163 may include sampling the position of a notch-type failure and sampling the position of a bridge-type failure. A notch-type failure may be induced when the contour image 140 becomes smaller than the IC layout 100 by a reference value and causes the cutting of patterns or a rise in the resistance of a conductive pattern. A bridge-type failure may be induced when the contour image 140 becomes greater than the IC layout 100 by a reference value and causes two adjacent patterns to stick to each other, resulting in a short circuit between conductive patterns.

The sampling of the position of a notch-type failure may include sampling the coordinates of positions at which a pattern width expected by the contour image 140 may be smaller than the pattern width of the IC layout 100 by a reference value. Also, the sampling of the position of a bridge-type failure may include sampling the coordinates of positions at which a space expected by the contour image 140 may be smaller than the space of the IC layout 100 by a reference value. In this process, the weak point data 163 may contain information on positions at which notches and bridges may occur.

Figure 7B:
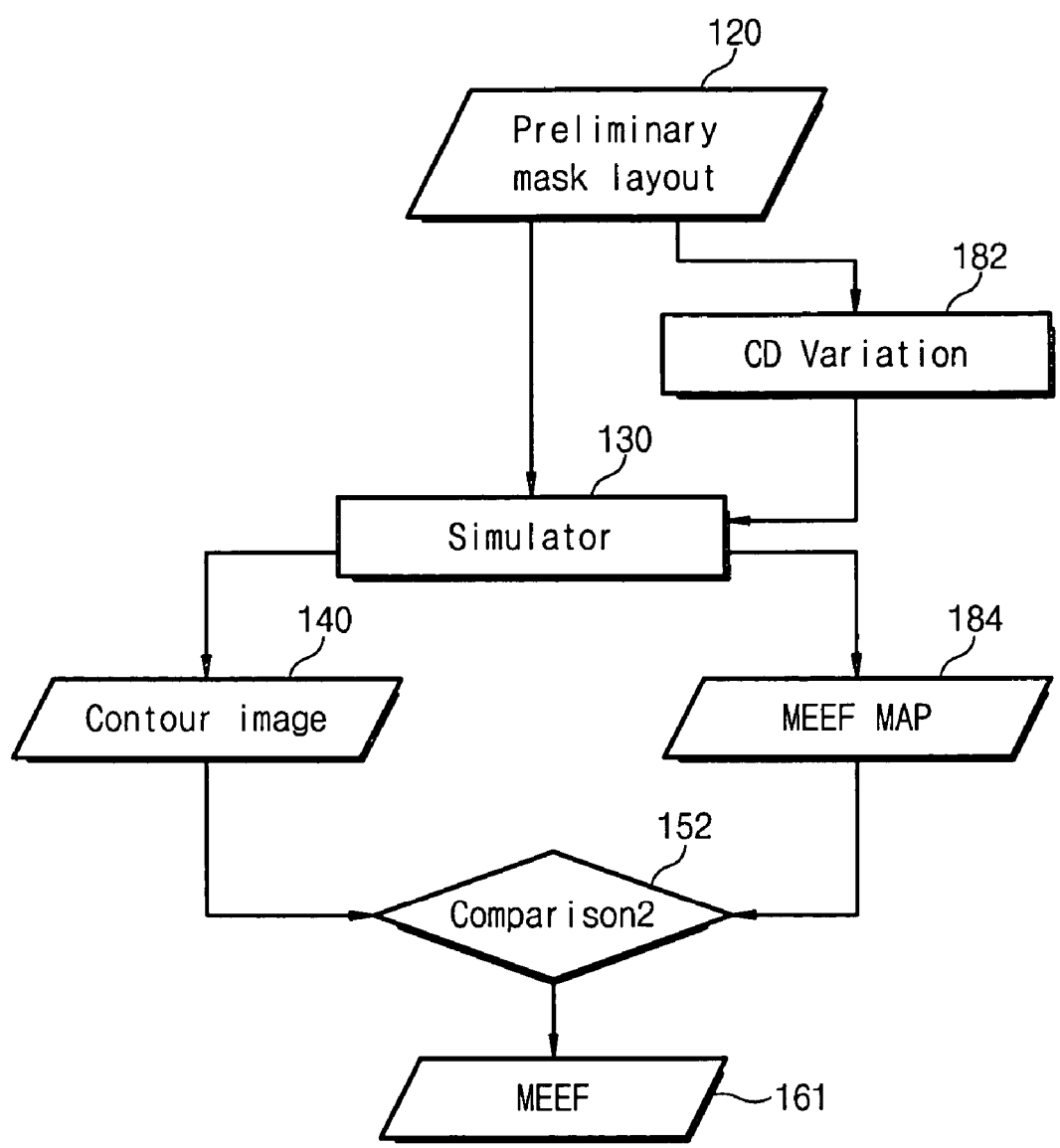
FIG. 7B is a process flow chart illustrating a method of sampling mask error enhancement factor (MEEF) data according to example embodiments.

FIG. 7B is a process flow chart illustrating a method of sampling MEEF data according to example embodiments.

Referring to FIG. 7B, the MEEF data 161 may be sampled based on the results of a comparison 152 of the contour image 140 and a MEEF map 184 obtained by processing the preliminary mask layout 120. The MEEF map 184 may comprise the results of a simulation for estimating a variation in a lithography process affected by various process deviations associated with a photo mask. A fine variation in linewidth (e.g., critical dimension (CD)) caused during the fabrication of the photo mask may be one example of a process deviation. Also, fine variations in various process parameters related to the lithography process may be other examples of process deviations.

Figure 12A:
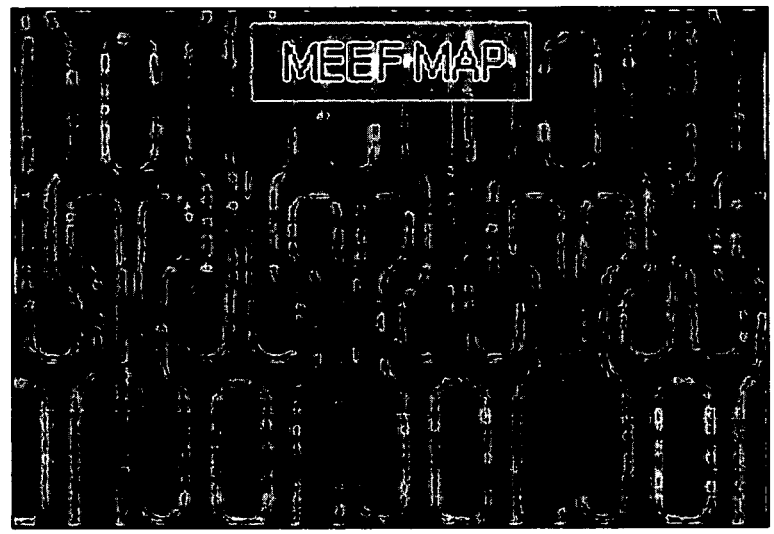
FIG. 12A is an example photograph demonstrating an example of a MEEF map.
Figure 12B:

The preparation of the MEEF map 184 may include globally changing the CD of patterns defined by the preliminary mask layout 120 to a predetermined or given dimension, as illustrated in FIG. 7B. Thereafter, the MEEF map 184 may express an estimated profile of a photoresist pattern to be formed on a wafer and may be completed using the simulator 130. As a result, the MEEF map 184 may represent a variation of the contour image 140 with respect to process deviation. Thus, information on positions affected by the process deviation (e.g., positions at which the process deviation may be liable to failures) may be obtained by comparing the MEEF map 184 with the contour image 140. The comparison of the MEEF map 184 with the contour image 140 may be made in the same manner as the method of obtaining the weak point data 163. FIG. 12A is a photograph illustrating an example of a MEEF map, and FIG. 12B is a photograph showing a result obtained by superposing the MEEF map on the contour image in order to make the above-described comparison. Markers illustrated in FIGS. 12A and 12B may be formed to monitor critical points, which will be described in detail later.

FIG. 8 is a process flow chart illustrating a method of sampling marker distribution data according to example embodiments.

Referring to FIG. 8, the marker distribution data 162 may be obtained by making an analysis of the weak point data 163 or the MEEF data 161. For example, markers may be formed in notch and bridge weak points and their adjacent regions as illustrated in FIGS. 9A, 9B, 10A, and 10B or in points weak in MEEF characteristics and their adjacent regions as illustrated in FIGS. 12A and 12B. The distribution of the markers may be analyzed so that the marker distribution data 162 may be sampled. The distribution of the markers may be analyzed using a detector on the basis of a predetermined or given direction, position, and dimension. This analysis on the distribution of the markers provides data on the pattern type, dimension, and range of critical points (e.g., the notch and bridge weak points or the points weak in the MEEF characteristics).

Figure 11A:
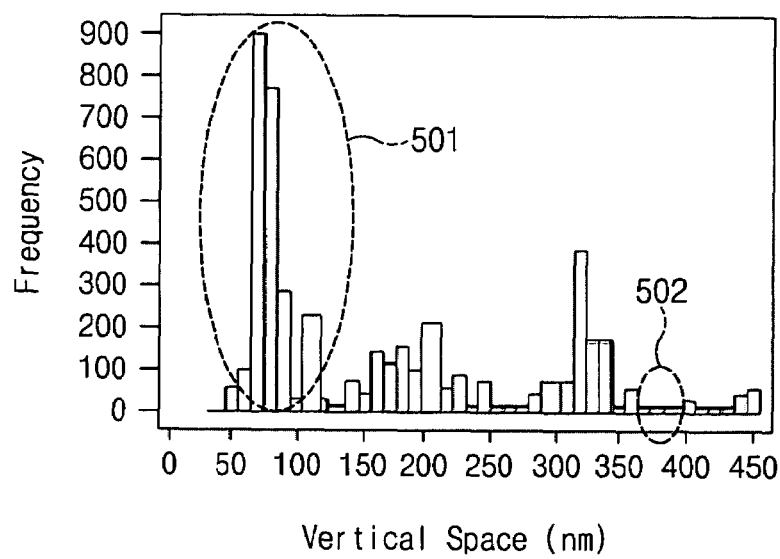
FIGS. 11A through 11C are example graphs illustrating a method of analyzing the distribution of markers.
Figure 11B:
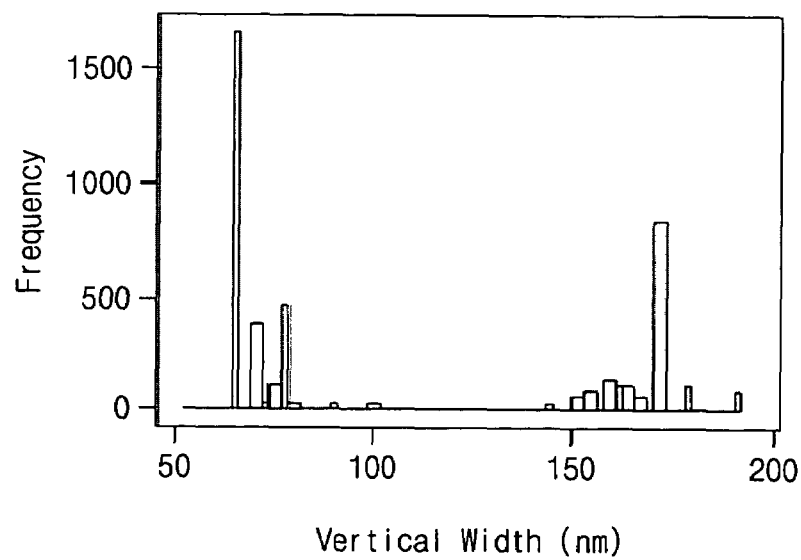
Figure 11C:
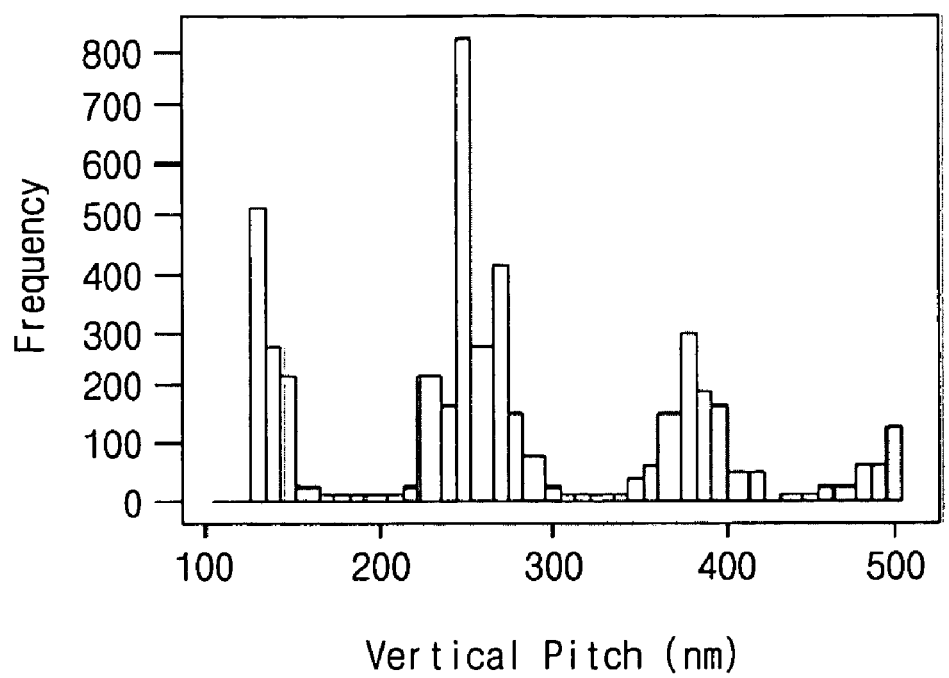

FIGS. 11A through 11C are graphs illustrating a method of analyzing the distribution of markers. For example, FIGS. 11A through 11C illustrate the frequencies of the markers with respect to pattern space, pattern width, and pattern pitch, respectively.

Referring to FIG. 11A, the markers may be classified into a high-frequency group 501 and a low-frequency group 502 depending on the frequency. For example, the markers belong to the high-frequency group 501 when a space between patterns ranges from about 50 to 100 nm, and the markers belong to the low-frequency group 502 when the space between the patterns ranges from about 350 to 400 nm, as illustrated in FIG. 11A. In example embodiments, the distribution of the markers may constitute the data 162 that may be classified on the basis of a reference frequency of, for example, about 100 and reference categories (e.g., space, width, and pitch). Furthermore, as stated above, the marker distribution data 162 may constitute the analysis data 170 used to automatically select the optimal OPC model 230 from the OPC model group 210 during the selection operation 220.

In example embodiments, the strict OPC model 230 may be applied to the patterns or partial regions including points belonging to the high-frequency group 501, while the less strict OPC model 230 may be applied to the patterns or partial regions including points belonging to the low-frequency group 502. The reference categories and reference frequency on which the analysis of the markers may be based may be modified if required.

In example embodiments, considering that the analysis data 170 may include arranged information on critical points, the analysis data 170 may be used to improve the data 105 for generating the preliminary mask layout. Also, the analysis data 170 may be conveyed to an engineer producing a photo mask or conducting a lithography process, thereby enhancing the efficiency of an inspection of the photo mask or the results of the lithography process.

After the OPC operation 240 is carried out, a simulation operation of estimating the results of a lithography process based on the mask layout 250 may be further performed. This simulation operation may contribute toward preventing or reducing an occurrence of fabricating an unsuitable photo mask.

According to example embodiments as described above, the OPC model, which may be the most suitable for the preliminary mask layout, may be automatically selected from the OPC model group based on analysis data that may be sampled from the preliminary mask layout. Thus, the method of fabricating the photo mask according to example embodiments may overcome the dependence on the engineers' experience regarding the appropriateness of the OPC model. As a result, example embodiments may prevent or reduce an occurrence of a drop in the productivity of an OPC process irrespective of the engineers' experience and enhance the accuracy of the OPC process.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. In the claims, means-plus-function clauses are intended to cover the structures described herein as performing the recited function, and not only structural equivalents but also equivalent structures. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of fabricating a photo mask, comprising:
    generating a preliminary mask layout;
    producing a contour image from the preliminary mask layout;
    producing analysis data by comparing the preliminary mask layout with the contour image and analyzing the comparison result for providing criteria used in selecting an optical proximity correction (OPC) model from an OPC model group;
    selecting an OPC model suitable for the preliminary mask layout from the OPC model group based on the analysis data; and
    generating a mask layout by performing an OPC process on the preliminary mask layout using the selected OPC model.

2. The method of claim 1, wherein the preliminary mask layout is based on an integrated circuit (IC) layout and the contour image produced using a simulation based on an optical model.

3. The method of claim 2, wherein the optical model includes data on process parameters applied to a lithography process and an etching process.

4. The method of claim 2, wherein generating the preliminary mask layout includes applying resolution enhancement technology (RET) to the IC layout by use of resolution enhancement data containing information on the RET.

5. The method of claim 4, further comprising:
    updating the resolution enhancement data using the analysis data.

6. The method of claim 2, wherein producing the analysis data includes producing weak point data and mask error enhancement factor (MEEF) data,
    wherein producing the weak point data includes producing a datum on a position of a weak point at which there is a difference between the IC layout and the contour image.

7. The method of claim 6, wherein producing the MEEF data includes:
    preparing a MEEF map by conducting a simulation for estimating an influence of a process deviation in a fabrication of the photo mask and a lithography process; and
    sampling data on points affected by the process deviation by comparing the MEEF map with the contour image.

8. The method of claim 6, wherein producing the weak point data includes:
    sampling a position of a notch-type failure induced when the contour image becomes smaller than the IC layout; and
    sampling a position of a bridge-type failure induced when the contour image becomes greater than the IC layout.

9. The method of claim 6, wherein producing the analysis data further includes producing marker analysis data based on at least one of the weak point data and the MEEF data, wherein producing of the marker analysis data includes:
    forming markers in one of critical points and adjacent regions thereof; and
    sampling data on a pattern type, dimension, and range of the critical point by analyzing a distribution of the markers based on directions, positions, and dimensions.

10. The method of claim 9, wherein the critical points include at least one point at which there is a difference between the preliminary mask layout and the contour image, which constitute the weak point data, and at least one point at which there is a difference between the MEEF map and the contour image, which constitute the MEEF data.

11. The method of claim 1, wherein selecting the OPC model group includes analyzing lithography data obtained using a test mask containing patterns with various structures and sizes according to a pattern type and size.

12. The method of claim 1, wherein selecting the OPC model group includes analyzing an influence of process parameters on a lithography process.

13. The method of claim 1, wherein the analysis data includes information on pattern types, a criteria set for admitting models, and critical points.

14. The method of claim 13, wherein selecting the OPC model includes:
    selecting at least one OPC model applicable to the preliminary mask layout from the OPC model group based on information on the pattern types and the critical points, which constitute the analysis data;
    evaluating an appropriateness of the at least one OPC model based on the criteria set for admitting models, which constitute the analysis data; and
    selecting an OPC model with the highest appropriateness from the at least one OPC model.

15. The method of claim 13, wherein selecting of the OPC model further includes:
    dividing the preliminary mask layout into a plurality of partial regions; and selecting a localized OPC model suitable for each of the partial regions.

16. The method of claim 15, wherein selecting of the localized OPC model includes:

selecting an OPC model to which strict criteria are applied when a selected partial region includes the critical point; and selecting an OPC model to which less strict criteria are applied when the selected partial region is freed from the critical point.

17. The method of claim 15, wherein performing the OPC process includes locally performing an OPC process on each of the partial regions using the localized OPC model.

18. The method of claim 15, wherein selecting of the localized OPC model includes one of:

selecting an OPC model to which strict criteria are applied when a selected partial region includes the critical point; and selecting an OPC model to which less strict criteria are applied when the selected partial region is freed from the critical point.

19. The method of claim 1, after performing the OPC process, further composing:

appreciating a appropriateness of the mask layout by a simulation of estimating a result of a lithography process based on the mask layout.

20. The method of claim 1, wherein selecting the OPC model includes automatically selecting an optimal OPC model from the OPC model group based on the analysis data that is sampled from the preliminary mask layout.

* * * * *